(12) United States Patent
Jiang et al.

(10) Patent No.: US 6,452,271 B2
(45) Date of Patent: Sep. 17, 2002

(54) INTERCONNECT COMPONENT FOR A SEMICONDUCTOR DIE INCLUDING A RUTHENIUM LAYER AND A METHOD FOR ITS FABRICATION

(75) Inventors: Tongbi Jiang, Boise; Li Li, Meridian, both of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/127,041

(22) Filed: Jul. 31, 1998

(51) Int. Cl.[7] ............................................... H01L 23/48
(52) U.S. Cl. ..................... 257/750; 257/751; 257/766; 257/777; 257/778; 257/913
(58) Field of Search .......................... 257/43, 750, 751, 257/766, 771, 777, 778, 915

(56) References Cited

U.S. PATENT DOCUMENTS

| | | | |
|---|---|---|---|
| 4,851,895 A | * | 7/1989 | Green et al. ................. 257/769 |
| 5,003,428 A | * | 3/1991 | Shepherd ..................... 361/321 |
| 5,260,234 A | | 11/1993 | Long |
| 5,313,089 A | * | 5/1994 | Jones, Jr. ..................... 257/296 |
| 5,495,667 A | | 3/1996 | Farnworth et al. |
| 5,508,881 A | * | 4/1996 | Stevens ....................... 361/305 |
| 5,510,651 A | * | 4/1996 | Maniar et al. ............... 257/295 |
| 5,587,336 A | | 12/1996 | Wang et al. |
| 5,663,598 A | | 9/1997 | Lake et al. |
| 5,686,318 A | | 11/1997 | Farnworth et al. |
| 5,693,565 A | | 12/1997 | Camilletti et al. |

\* cited by examiner

*Primary Examiner*—Fetsum Abraham
(74) *Attorney, Agent, or Firm*—Dickstein Shapiro Morin & Oshinsky LLP

(57) ABSTRACT

A multi-layered metal bond pad for a semiconductor die having a conductive metal layer and an overlying ruthenium electrode layer. The ruthenium electrode layer protects the conductive metal from oxidation due to ambient environmental conditions. An interconnect structure such as a wire bond or solder ball may be attached to the ruthenium layer to connect the semiconductor die to a lead frame or circuit support structure. Also disclosed are processes for forming the ruthenium layer.

37 Claims, 3 Drawing Sheets

US 6,452,271 B2

INTERCONNECT COMPONENT FOR A SEMICONDUCTOR DIE INCLUDING A RUTHENIUM LAYER AND A METHOD FOR ITS FABRICATION

FIELD OF THE INVENTION

The present invention relates to the field of interconnect structures for integrated circuit packages, and in particular, to an interconnect structure for electrically connecting two electronic components and a method of making the same.

BACKGROUND OF THE INVENTION

In the semiconductor industry, an integrated circuit (IC) device must be connected to a lead frame or some other support structure to produce a complete IC package. Technology has recently produced more powerful devices which can be packaged more densely. However, as the size of the devices decreases, new problems arise associated with connecting the devices to the lead frames or other support structures.

An integrated circuit is usually fabricated on a semiconductor wafer which has a number of bond pads on its surface which connect to various components of the circuit. The bond pads are connected to a wire or other electrically conductive device to permit utilization of the IC. Common methods of connecting a device to a lead frame or other support device are wire bonding, Tape Automated Bonding (TAB), Controlled Collapse Chip Connection (C4) or bump bonding, and the use of conductive adhesives.

Aluminum bond pads are the semiconductor industry standard, but a significant problem with their use is the rapid formation of a tenacious nonconductive oxide on the surface of the metal, even at room temperature. When an interconnect is made to the bond pad, the nonconductive oxide causes the interconnect to have an extremely high contact resistance. The resistance typically ranges from hundreds to millions of ohms.

In an effort to reduce the contact resistance, a noble metal, such as gold, has been used to provide an inert, oxide-free surface on the bond pad. The presence of gold on the bond pad precludes the formation of nonconductive metal oxides at the surface of the contact. However, the gold plating of a semiconductor die is an elaborate process that can be very difficult, expensive and time consuming. Another disadvantage to the use of gold is that gold and aluminum react to form an intermetallic mixture, known in the art as "purple plague", which is a poor conductor and interferes with the electrical functioning of the circuit.

Other methods of solving this problem have involved scraping the bond pad to remove oxide immediately before the interconnect is formed, or use of a barrier layer on the bond pad. Known barrier layer materials include nickel, copper, cobalt, palladium, platinum, silver, titanium, tungsten, tin, and chromium. Many of these materials, however, also form nonconductive oxides, or have poor electrical or thermal conductivity, or a high thermal expansion. In addition, the plating processes for these materials may be complicated. Palladium plating, for example, requires both a zincate process and a plating process.

There is needed, therefore, a conductive barrier layer for use on the bond pads of an integrated circuit die that will not oxidize to form a nonconductive material. A conductive barrier layer material having good electrical conductivity, good thermal conductivity, and low thermal expansion is also needed, as well as a simple process for forming such a conductive barrier layer on the metal layer of bond pads.

SUMMARY OF THE INVENTION

The present invention provides an interconnect structure comprising a multi-layered metal bond pad on the surface of a semiconductor die. The outermost surface of the bond pad is a conductive ruthenium electrode that protects an underlying conductive layer from oxidation due to exposure to ambient environmental conditions. An electrical interconnect structure such as a wire or solder ball bump may be placed directly on the ruthenium layer in order to connect the semiconductor die to a lead frame or circuit support structure. Also provided is an electrolytic plating method for forming the ruthenium electrode of the present invention.

Advantages and features of the present invention will be apparent from the following detailed description and drawings which illustrate preferred embodiments of the invention.

DETAILED DESCRIPTION OF THE PREFERRED EMBODIMENTS

Figure 1:
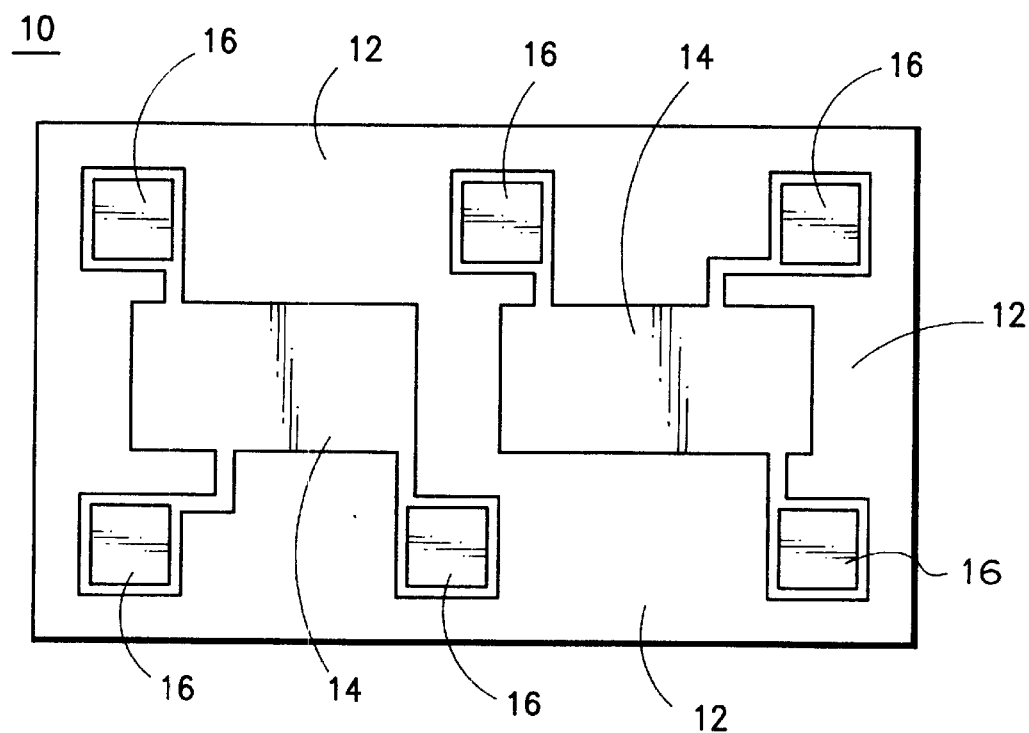
FIG. 1 is a top view of the semiconductor die of a preferred embodiment of the present invention.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" or "substrate" used in the following description include any semiconductor-based structure having an exposed silicon or germanium surface in which to form the structure of this invention. "Wafer" and "substrate" are to be understood as including silicon-on-insulator, doped and undoped semiconductors, epitaxial layers of silicon supported by a base semiconductor foundation, and other semiconductor structures. Furthermore, when reference is made to a wafer or substrate in the following description, previous process steps may have been utilized to form regions or junctions in the base semiconductor structure or foundation. When referring to aqueous solutions described herein, the term "percent" refers to the percent measured by weight, e.g., a 10% hydrochloric acid solution is 10% by weight hydrochloric acid.

The term "bond pad" is intended to include and encompass all suitable terminal structures to which a bond may be made, including both elevated and recessed bond pads as well as flat, concave or convex bond pads and other terminal structures. As used herein, it should be understood that the term "ruthenium" includes not only elemental ruthenium, but ruthenium with other trace metals or in various alloyed combinations with other metals as known in the semiconductor art, as long as such alloy is conductive. Elemental ruthenium undergoes limited oxidization at ambient conditions to form a conductive ruthenium oxide, which functions similarly to elemental ruthenium for the purposes of the present invention.

The term "ambient oxidizable metal", as used herein, refers to a metal which readily oxidizes upon exposure to ambient atmospheric conditions to form a nonconductive metal oxide. Examples of ambient oxidizable metals include aluminum, which oxidizes readily at room temperature (~20 to 30 degrees Celsius) to form nonconductive alumina ($Al_2O_3$), nickel, copper, tungsten, titanium, and molybdenum. For purposes of illustration, the embodiments of the present invention are set forth using aluminum as an exemplary ambient oxidizable metal, because aluminum is currently the standard metal for bond pads in the semiconductor industry. The aluminum may be alloyed with, or used in combination with copper or another ambient oxidizable metal. It should be understood, however, that the present invention is not limited to use with aluminum electrodes, and is designed for use with any suitable ambient oxidizable metal.

In addition, the invention is not limited to a particular form of interconnect structure, but may be used with any interconnect structure such as wires, TAB, C4 or bumps, conductive adhesives, or the like. Exemplary embodiments are illustrated as using bumps for a flip-chip arrangement, but these embodiments are only some of many examples of the present invention which will be apparent to one of skill in the art given the teachings herein. The following detailed description is, therefore, not to be taken in a limiting sense, and the scope of the present invention is defined by the appended claims.

Referring now to the drawings, where like elements are designated by like reference numerals, an embodiment of the ruthenium electrode of the present invention is illustrated in FIGS. 1 through 4. This embodiment is a multi-layer bond pad having a top ruthenium layer covering an underlying layer of ambient oxidizable metal.

As shown in FIG. 1, the semiconductor die 10 is a conventional die that includes a silicon substrate 12 on which integrated circuits 14 have been formed. Bond pads 16 are connected electrically to the integrated circuits 14. During the manufacturing process the die 10 is fabricated on a wafer with a large number of other dice. Each die 10 on the wafer may subsequently be singulated by saw cutting or other suitable means. The surface of the die 10 containing integrated circuits 14 is coated by a passivation layer 18 which leaves the bond pads 16 exposed. The passivation layer 18 may be silicon dioxide, silicon nitride, a polyimide, or other material suitable for protecting the integrated circuits 14.

Figure 2:
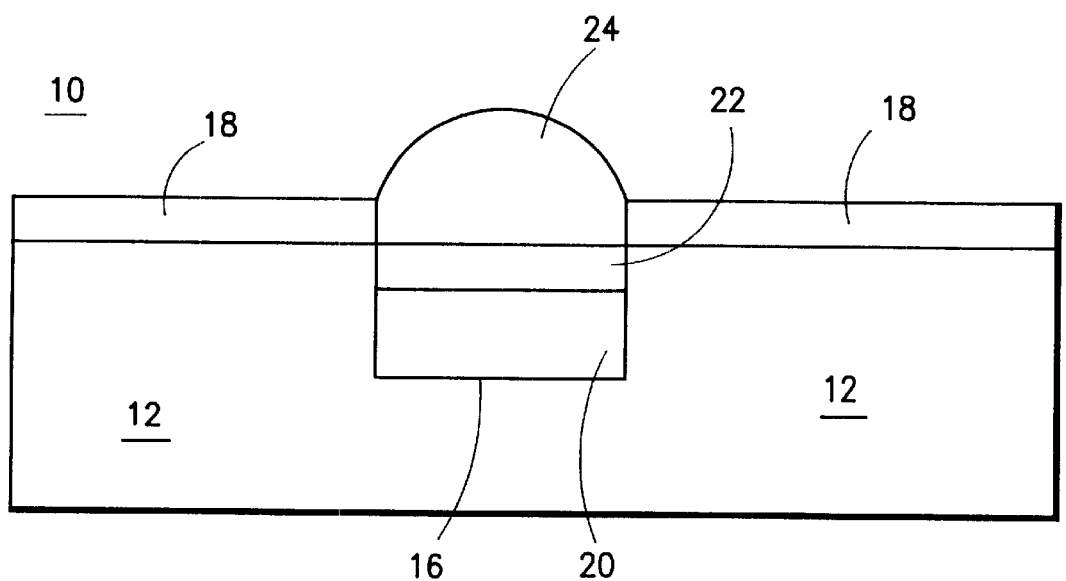
FIG. 2 is a cross-sectional view of the semiconductor die of FIG. 1.

Referring now to FIG. 2, the bond pads 16 are typically polygonal (e.g., square) metal pads, about 100 microns on a side. The bond pads 16 comprise a conductive layer 20 of an ambient oxidizable metal such as aluminum, and a ruthenium electrode layer 22 located on the conductive layer 20. The conductive layer may be of any suitable thickness, for example, approximately 3000 to 6000 Angstroms thick, and the ruthenium electrode is of a suitable thickness such as approximately 50 to 200 Angstroms. A layer thinner than approximately 50 Angstroms is typically less desirable because of the slightly porous nature of many ruthenium materials. An electrical interconnect structure 24, such as a bump, wire, conductive adhesive, or tape is located on the ruthenium electrode 22.

Figure 3:
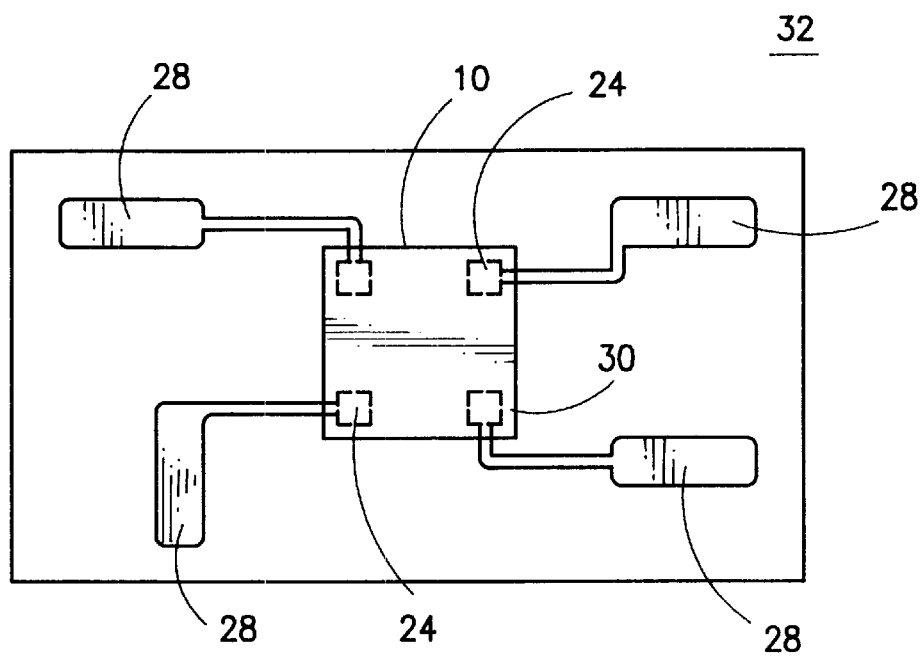
FIG. 3 is a top view of an integrated circuit package containing the semiconductor die of FIG. 1 electrically connected to a circuit substrate.
Figure 4:
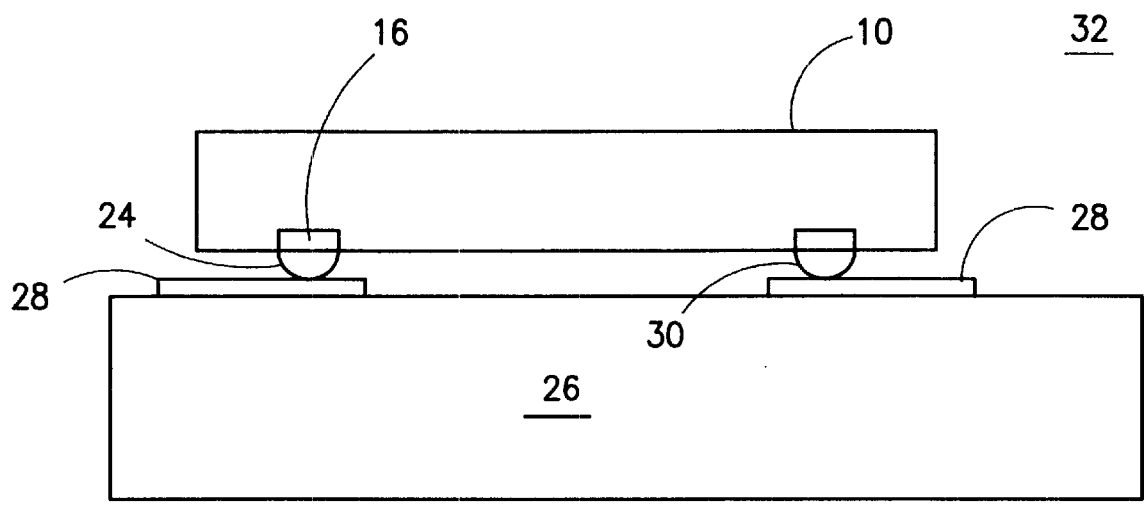
FIG. 4 is a cross-sectional view of the integrated circuit package of FIG. 3.

FIGS. 3 and 4 illustrate the interconnection between the semiconductor die 10 and a circuit substrate 26. The circuit substrate 26 is a lead frame or other support 15. structure which, in connection with the die 10, produces a complete IC package 32. A surface circuit trace 28 on the circuit substrate 26 defines a bonding site 30. During packaging, an electrical connection is formed between the die 10 and the circuit substrate 26 by placing the die 10 onto the circuit substrate 26 so that the bonding site 30 comes into contact with the electrical interconnect structure 24.

The ruthenium electrode 22 is manufactured through a process described as follows, and illustrated by FIGS. 5 through 7. The embodiment described herein involves an acid strip of metal oxide from the surface of the ambient oxidizable metal prior to formation of the ruthenium layer. The ruthenium layer is formed via a plating process, preferably an electrolytic process. The ruthenium electrode manufacturing process begins subsequent to the formation of integrated circuitry on a semiconductor die 10, and is usually carried out as one of the final stages of IC fabrication.

Figure 5:
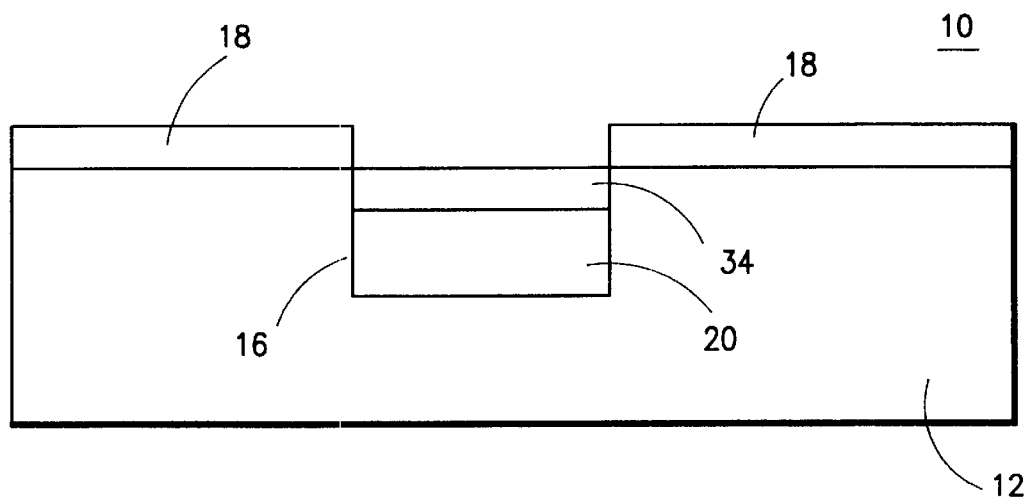
FIG. 5 is a cross-sectional view of a semiconductor die undergoing the process of a preferred embodiment of the invention.

As shown in FIG. 5, prior to formation of the ruthenium electrode, the bond pad 16 comprises a conductive layer 20 of an ambient oxidizable metal such as aluminum, which has oxidized to form a metal oxide layer 34 located on the conductive layer 20. A passivation layer 18 is then formed on the surface of the die 10 to cover integrated circuit structures (not shown) and protect them from chemical action, corrosion, and handling. The passivation layer 18 is formed as a blanket across the surface of the wafer, and conventional techniques are then used to define the bond pads 16, and to selectively remove the passivation layer 18 to expose the bond pads 16. The passivation layer 18 may be silicon dioxide, silicon nitride, a polyimide, or other material suitable for protecting the integrated circuits 14.

Figure 6:
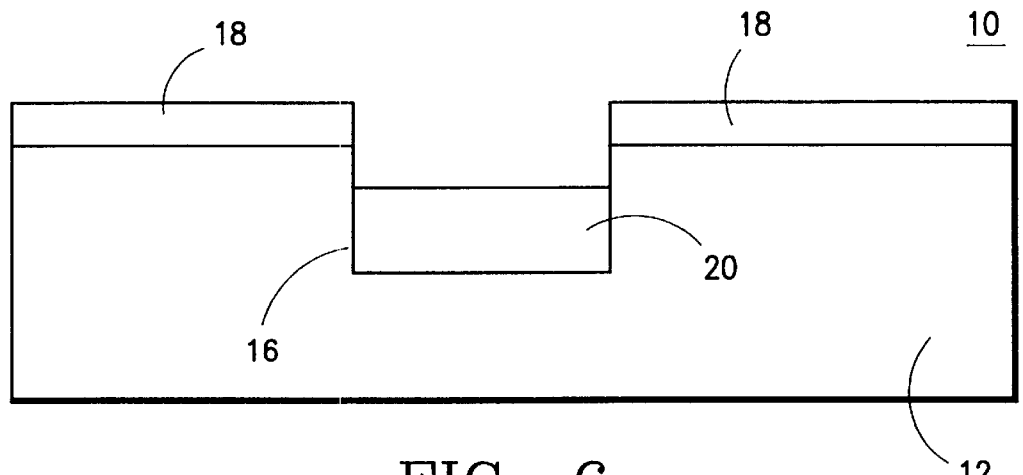
FIG. 6 shows the die of FIG. 5 at a processing step subsequent to that shown in FIG. 5.

Referring now to FIG. 6, the first step in the formation of the ruthenium electrode is the removal of the metal oxide layer 34 from the bond pad 16. Removal occurs by an acid stripping process in which the die 10 is submerged into an acid bath for a time sufficient to completely remove the metal oxide layer 34 from the surface of the conductive layer 20. Any suitable acid which attacks the metal oxide layer 34 but not the passivation layer 18 may be used, for example, the use of hydrochloric acid (HCl) is preferred for stripping alumina. Suitable acid strengths include 0.001 to 10% acid in aqueous solution. A preferred acid solution is 0.1% HCl. If the metal oxide layer 34 is alumina, the following reaction occurs:

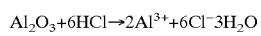

$$Al_2O_3 + 6HCl \rightarrow 2Al^{3+} + 6Cl^- 3H_2O$$

The structure of the bond pad 16 after the acid stripping step is shown in FIG. 6.

Figure 7:
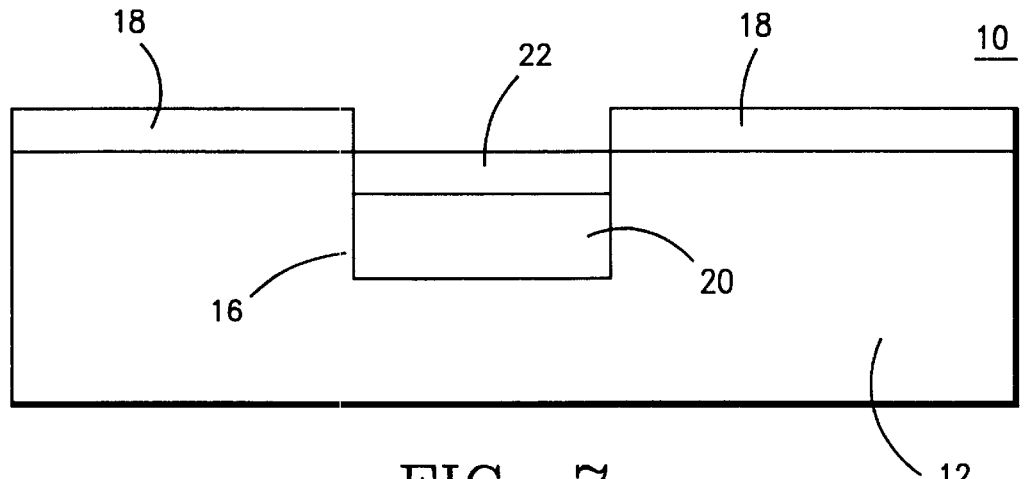
FIG. 7 shows the die of FIG. 5 at a processing step subsequent to that shown in FIG. 6.

Subsequent to the removal of the metal oxide layer 34, a ruthenium electrode layer 22 is formed on the surface of the conductive layer 20 by a plating process, as shown in FIG. 7. The plating process is carried out by submerging the die 10 into a plating bath containing an aqueous ruthenium solution. The aqueous ruthenium solution will accept electrons from, and plate to, the conductive layer 20 in an oxidation-reduction or "redox" reaction, resulting in the structure shown in FIG. 7. The aqueous ruthenium solution contains ruthenium associated with a base such as hydroxide in a concentration of 0.1 to 20%. A preferred concentration is 10% ruthenium hydroxide (Ru(OH)$_3$). If the conductive layer 20 is formed of aluminum, the following reaction will occur:

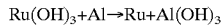

$$Ru(OH)_3 + Al \rightarrow Ru + Al(OH)_3$$

The plating process is performed for a time sufficient for a ruthenium layer 22 of a desired thickness to form. The time that the die 10 must remain in the bath depends on the thickness of the layer 22 desired. A reaction time of several seconds to ten to twenty minutes is generally suitable to form a layer 22 approximately 50 to 200 Angstroms thick. The plating process may be carried out at substantially any temperature, but is preferably performed at temperatures of 10 to 100 degrees Celsius, and most preferably is carried out at room temperature (~20 to 30 degrees Celsius).

The plating bath in a preferred embodiment is electrolytic, but an electroless bath may also be used. An electrolytic bath permits formation of a thicker ruthenium layer 22 than an electroless bath.. This is because the aluminum (or other conductive layer material) electrons are continuously replaced by the electric current applied and therefore the plating solution, which has an electron affinity, may continuously plate to the conductive layer 20. If desired, the plating process may begin as an electroless process, and a voltage may later be applied to carry out an electrolytic plating process.

Acid stripping and ruthenium plating may be carried out separately by utilizing separate acid and plating baths, as described above, but preferably are carried out simultaneously by using a single bath containing acid and a ruthenium compound such as ruthenium hydroxide. A preferred solution is an aqueous solution of 0.1% HCl and 10% Ru(OH)$_3$. These compounds are preferred for use together because aluminum ions will dissolve in the solution, and ruthenium metal is insoluble in hydrochloric acid.

In addition, any number of semiconductor dice may be simultaneously processed by using a large bath, thereby reducing the cost of manufacture. The dice may be processed while conjoined in a wafer, or after singulation. The process of the present invention is not limited to semiconductor processing, however, and may be used in any application in which an ambient oxidizable. metal is used as an electrode.

Subsequent to the plating process, an electrical interconnect structure 24, such as a bump, wire, conductive adhesive, or tape may be formed by conventional means on the ruthenium electrode 22. The semiconductor die 10 may then be electrically connected to a circuit substrate 26 to form a complete IC package 32. The die 10 is placed onto the circuit substrate 26 so that the bonding site 30 of the circuit substrate 26 comes into contact with the electrical interconnect structure 24 on the die 10. Further steps to complete the IC package 32 may now be carried out.

As can be seen by the embodiments described herein, the present invention encompasses a multi-layer bond pad having an outermost ruthenium electrode layer and an underlying ambient oxidizable metal layer. The ruthenium electrode may be formed with a simple one-bath electroplating process that is easily automated.

The above description and drawings illustrate preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. An interconnect component for a semiconductor die comprising:
   a conductive bonding pad containing an ambient oxidizable metal layer, said ambient oxidizable metal layer being substantially non-conducting when oxidized;
   a ruthenium layer covering at least a portion of the ambient oxidizable metal layer; and
   an electrically conductive interconnect structure covering at least a portion of the ruthenium layer for connecting the semiconductor die to a circuit support structure.

2. The interconnect component of claim 1, wherein the ambient oxidizable metal is aluminum.

3. The interconnect component of claim 1, wherein the ambient oxidizable metal is nickel.

4. The interconnect component of claim 1, wherein the ambient oxidizable metal is copper.

5. The interconnect component of claim 1, wherein the ambient oxidizable metal is aluminum mixed with copper.

6. The interconnect component of claim 1, wherein the ruthenium layer is elemental ruthenium.

7. The interconnect component of claim 1, wherein the ruthenium layer is ruthenium oxide.

8. The interconnect component of claim 1, wherein the ruthenium layer is at least 50 Angstroms thick.

9. A flip-chip interconnect bond comprising:
   a conductive bonding pad containing an ambient oxidizable metal layer; said ambient, oxidizable metal layer being substantially non-conducting when oxidized;
   a ruthenium layer covering at least a portion of the ambient oxidizable metal layer; and
   an electrically conductive bump bonded to the ruthenium layer.

10. The interconnect bond of claim 9, wherein the ambient oxidizable metal is aluminum.

11. The interconnect bond of claim 9, wherein the ambient oxidizable metal layer is approximately 3000 to 6000 Angstroms thick.

12. The interconnect bond of claim 9, wherein the ruthenium layer is approximately 50 to 200 Angstroms thick.

13. The interconnect bond of claim 9, wherein the electrically conductive bump is a solder ball.

14. The interconnect bond of claim 9 further comprising a circuit substrate bonded to the electrically conductive bump.

15. An integrated circuit comprising:
   a semiconductor die having integrated circuitry formed on a substrate;
   a conductive bonding pad on the surface of the die and in electrical connection with the die integrated circuitry, the conductive bonding pad having an ambient oxidizable metal layer, said ambient oxidizable metal layer being substantially non-conducting when oxidized;
   a ruthenium layer covering the ambient oxidizable metal layer;
   an electrically conductive structure bonded to the ruthenium layer; and
   a circuit substrate having a bonding site, wherein the electrically conductive structure of the semiconductor die is bonded to the bonding site.

16. The integrated circuit of claim 15, wherein the electrically conductive structure is a wire bond.

17. The integrated circuit of claim 15, wherein the electrically conductive structure is a tape automated bond.

18. The integrated circuit of claim 15, wherein the electrically conductive structure is a bump.

19. The integrated circuit of claim 15, wherein the electrically conductive structure is a conductive adhesive layer.

20. An electronic circuit bonding interconnect component for a semiconductor die, the interconnect comprising:
   a bond pad having an aluminum layer;
   a ruthenium layer covering the aluminum layer; and
   an electrically conductive interconnect structure bonded to the ruthenium layer for connecting the semiconductor die to a circuit support structure.

21. The integrated circuit of claim 20, wherein the aluminum layer is approximately 3000 to 6000 Angstroms thick.

22. The integrated circuit of claim 20, wherein the ruthenium layer is at least 50 Angstroms thick.

23. The integrated circuit of claim 20, wherein the electrically conductive interconnect structure is selected from the group consisting of a wire bond, a tape automated bond, a bump, and a conductive adhesive layer.

24. An interconnect component for a semiconductor die comprising:
   a conductive bonding pad containing a nickel layer; and
   a ruthenium layer covering at least a portion of the nickel layer.

25. The interconnect component of claim 24, wherein the ruthenium layer is elemental ruthenium.

26. The interconnect component of claim 24, wherein the ruthenium layer is ruthenium oxide.

27. The interconnect component of claim 24, wherein the ruthenium layer is at least 50 Angstroms thick.

28. An interconnect component for a semiconductor die comprising:
   a conductive bonding pad containing a nickel layer; and
   a ruthenium layer covering at least a portion of the nickel layer.

29. The interconnect component of claim 28, wherein the ruthenium layer is elemental ruthenium.

30. The interconnect component of claim 28, wherein the ruthenium layer is ruthenium oxide.

31. The interconnect component of claim 28, wherein the ruthenium layer is at least 50 Angstroms thick.

32. An interconnect component for a semiconductor die comprising:
   a conductive bonding pad containing a layer of aluminum mixed with copper; and
   a ruthenium layer covering at least a portion of the layer of aluminum mixed with copper.

33. The interconnect component of claim 32, wherein the ruthenium layer is elemental ruthenium.

34. The interconnect component of claim 32, wherein the ruthenium layer is ruthenium oxide.

35. The interconnect component of claim 32, wherein the ruthenium layer is at least 50 Angstroms thick.

36. An electronic circuit bonding interconnect component for a semiconductor die, the interconnect comprising:
   a bond pad having an aluminum layer approximately 3000 to 6000 Angstroms thick;
   a ruthenium layer covering at least a portion of the aluminum layer; and
   an electrically conductive interconnect structure bonded to the ruthenium layer for connecting the semiconductor die to a circuit support structure.

37. An electronic circuit bonding interconnect component for a semiconductor die, the interconnect comprising:
   a bond pad having an aluminum layer;
   a ruthenium layer at least 50 Angstroms thick covering at least a portion of the aluminum layer; and
   an electrically conductive interconnect structure bonded to the ruthenium layer for connecting the semiconductor die to a circuit support structure.

* * * * *

UNITED STATES PATENT AND TRADEMARK OFFICE
CERTIFICATE OF CORRECTION

PATENT NO. : 6,452,271 B1  Page 1 of 1
DATED : September 17, 2002
INVENTOR(S) : Tongbi Jiang et al.

It is certified that error appears in the above-identified patent and that said Letters Patent is hereby corrected as shown below:

<u>Column 7,</u>
Lines 37 and 38, "nickel" should be -- copper --.

Signed and Sealed this

Fifteenth Day of June, 2004

JON W. DUDAS
*Acting Director of the United States Patent and Trademark Office*